(12) United States Patent  
Amick et al.

(10) Patent No.: US 7,109,767 B1  
(45) Date of Patent: Sep. 19, 2006

(54) GENERATING DIFFERENT DELAY RATIOS FOR A STROBE DELAY

(75) Inventors: Brian W. Amick, Brookline, MA (US); Aparna Ramachandran, Sunnyvale, CA (US); Dong J. Yoon, San Jose, CA (US); Tri K. Tran, San Leandro, CA (US); Gajendra P. Singh, Sunnyvale, CA (US); Claude R. Gauthier, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 55 days.

(21) Appl. No.: 10/889,610

(22) Filed: Jul. 12, 2004

(51) Int. Cl.  
*H03L 7/06* (2006.01)

(52) U.S. Cl. ...................... 327/158; 327/149

(58) Field of Classification Search .......... 327/149, 327/153, 158, 161, 162, 163, 291, 292  
See application file for complete search history.

(56) References Cited

U.S. PATENT DOCUMENTS

| | | | |
|---|---|---|---|
| 6,181,168 B1 * | 1/2001 | Zarubinsky et al. | 327/12 |
| 6,289,068 B1 * | 9/2001 | Hassoun et al. | 375/376 |
| 6,483,871 B1 * | 11/2002 | Dawe | 375/228 |

OTHER PUBLICATIONS

Satoshi Eto, et al., "A 1Gb SDRAM with Ground Level Precharged Bitline and Non-Boosted 2.1V Word Line," IEEE International Solid-State Circuits Conference, 1998, pp. 82-83.

Atsushi Hatakeyama, et al., "A 256-Mb SDRAM Using a Register-Controlled Digital DLL," IEEE Journal of Solid-State Circuits, vol. 32, No. 11, Nov. 1997, pp. 1728-1734.

Georgios Konstadinidis, et al., "Implementation of a Third-Generation 1.1GHz 64b Microprocessor," ISSCC 2002, Feb. 6, 2002, 3 pages.

Feng Lin, et al., "A Register-Controlled Symmetrical DLL for Double-Data-Rate DRAM," IEEE Journal of Solid-State Circuits, vol. 34, No. 4, Apr. 1999, pp. 565-568.

Kevin Ryan, "DDR SDRAM Functionality and Controller Read Data Capture," DesignLine, vol. 8, Issue 3, 3rd Quarter 1999, pp. 1-24.

* cited by examiner

*Primary Examiner*—Linh My Nguyen  
(74) *Attorney, Agent, or Firm*—Zagorin O'Brien Graham LLP

(57) ABSTRACT

A digital delay-locked loop has been discovered having a reduced area as compared to typical register-controlled delay-locked loops (RDLLs) used to control strobe delay lines that provide delay to strobe signals driving asynchronous FIFOs. This result is achieved by reducing ratio computation (i.e. gear logic) circuitry of the RDLL. A master delay line receives a control code to delay a reference clock by one clock period. A slave delay line receives the control code to delay a strobe signal by a predetermined fraction of the clock period. The master delay line may include individual sections responsive to the control code which effectively delay a signal by a portion of the clock period, the delay having a fixed relationship to a delay associated with individual sections of the slave delay line.

52 Claims, 5 Drawing Sheets

1

GENERATING DIFFERENT DELAY RATIOS FOR A STROBE DELAY

CROSS-REFERENCE TO RELATED APPLICATION(S)

BACKGROUND

1. Field of the Invention

The present invention relates generally to techniques for delaying a signal, and more particularly, to digital delay-locked loops.

2. Description of the Related Art

Integrated circuit microprocessors typically interface to off-chip memory circuits (e.g., synchronous dynamic random-access memory, i.e., 'SDRAM') that transmit a strobe clock and data to the microprocessor. The strobe and data signals transmitted by the memory transition at the same time, i.e., the strobe and data are edge-aligned. Data may be transmitted on both rising and falling edges of the strobe or clock. In order to sample data in the middle of the data valid region, an on-chip memory interface typically delays the strobe. The strobe delay may be implemented in digital circuitry by a delay line controlled by a delay-locked loop (DLL), (e.g., a digital DLL).

Digital DLLs typically include a digital delay line and a controller including digital logic gates. The controller provides a set of control bits to the digital delay line that is used to delay a clock signal. The controller determines if the delay of the delay line is more or less than a desired delay based on the clock signal and the delayed clock signal, and the controller adjusts the control bits accordingly. The result is a feedback system that continually calibrates a delay line to provide a specific delay on the integrated circuit across all process, voltage, and temperature (PVT) variations (e.g., fast or slow process, low or high supply voltage, hot or cold transistors, etc.).

The control bits for the DLL delay line (i.e., master line) correspond to a constant delay across PVT variations and can be used by the strobe delay line to provide a constant delay. Since the control bits correspond to a fixed amount of delay, (i.e., the period of the clock fed into the DLL), the control code is used by gear or ratio logic before being sent to the strobe or delay line (i.e., slave line). The gear logic typically performs mathematical operations on the control bits to determine a desired delay for the strobe delay line and corresponding control signals for the strobe delay line. Due to the complexity of implementing mathematical operations, the gear logic may consume significant amounts of integrated circuit area. Accordingly, improved techniques for generating signals controlling a delay of a strobe delay line are desired.

SUMMARY

A digital delay-locked loop has been discovered having a reduced area as compared to typical register-controlled delay-locked loops (RDLLs) used to control strobe delay lines that provide delay to strobe signals driving asynchronous FIFOs. This result is achieved by reducing ratio computation (i.e. gear logic) circuitry of the RDLL. A master delay line receives a control code to delay a reference clock by one clock period. A slave delay line receives the control code to delay a strobe signal by a predetermined fraction of the clock period. The master delay line may include individual sections responsive to the control code which effectively delay a signal by a portion of the clock period, the delay having a fixed relationship to a delay associated with individual sections of the slave delay line.

In some embodiments of the present invention, an integrated circuit includes a first delay circuit and a second delay circuit coupled to receive a control code. The control code configures the first delay circuit to delay a reference clock signal by one clock period. The control code configures a second delay circuit to delay a signal by a predetermined fraction of the clock period.

In some embodiments of the present invention, a method includes delaying a reference clock by one period using a first delay circuit. The method includes delaying a control signal by a predetermined fraction of the clock period using a second delay circuit. The method includes controlling the first and second delay circuits using a control code based at least in part on the reference clock and the delayed reference clock.

In some embodiments of the present invention, a method of manufacturing an integrated circuit design includes forming a first delay circuit and a second delay circuit coupled to receive a control code. The control code configures the first delay circuit to delay a reference clock signal by one clock period. The control code configures a second delay circuit to delay a signal by a predetermined fraction of the clock period.

In some embodiments of the present invention, a delay-locked loop (DLL) has a first delay line and a second delay line. The first delay line is responsive to a control code to delay a reference clock by at least a portion of one clock period. The second delay line is responsive to the control code to delay a signal by at most a predetermined fraction of the reference clock period. The control code is based at least in part on an output of the first delay line.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1A:
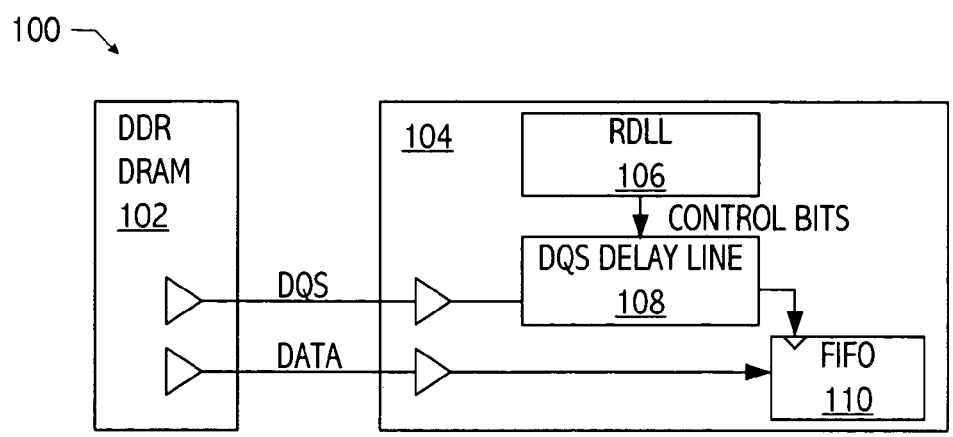
FIG. 1A illustrates an exemplary memory interface.
Figure 1B:
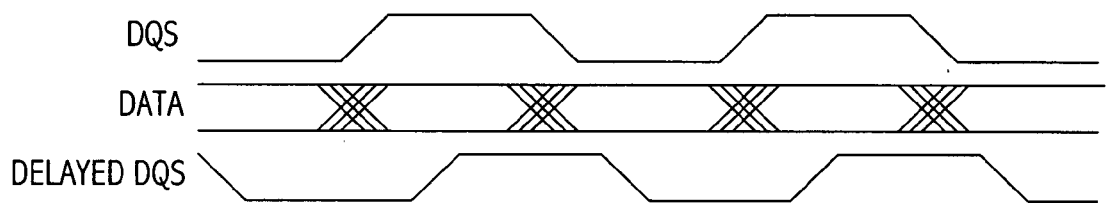
FIG. 1B illustrates an exemplary memory interface waveforms.

Referring to FIG. 1A, an exemplary memory system (i.e., memory system 100) includes a dual-data rate dynamic random access memory (i.e., DDR DRAM 102) coupled to a memory interface 104. Memory interface 104 includes a master register delay-locked loop (i.e., RDLL 106) coupled to a slave strobe delay line (i.e., DQS delay line 108). DQS delay line 108 delays a strobe signal (i.e., DQS) by an amount specified by control bits received from RDLL 106. As illustrated in FIG. 1B, the delayed strobe signal (i.e., delayed DQS) clocks data from DDR DRAM 102 into state elements included in FIFO 110, when the data has stabilized, according to the delayed DQS signal.

Figure 2:
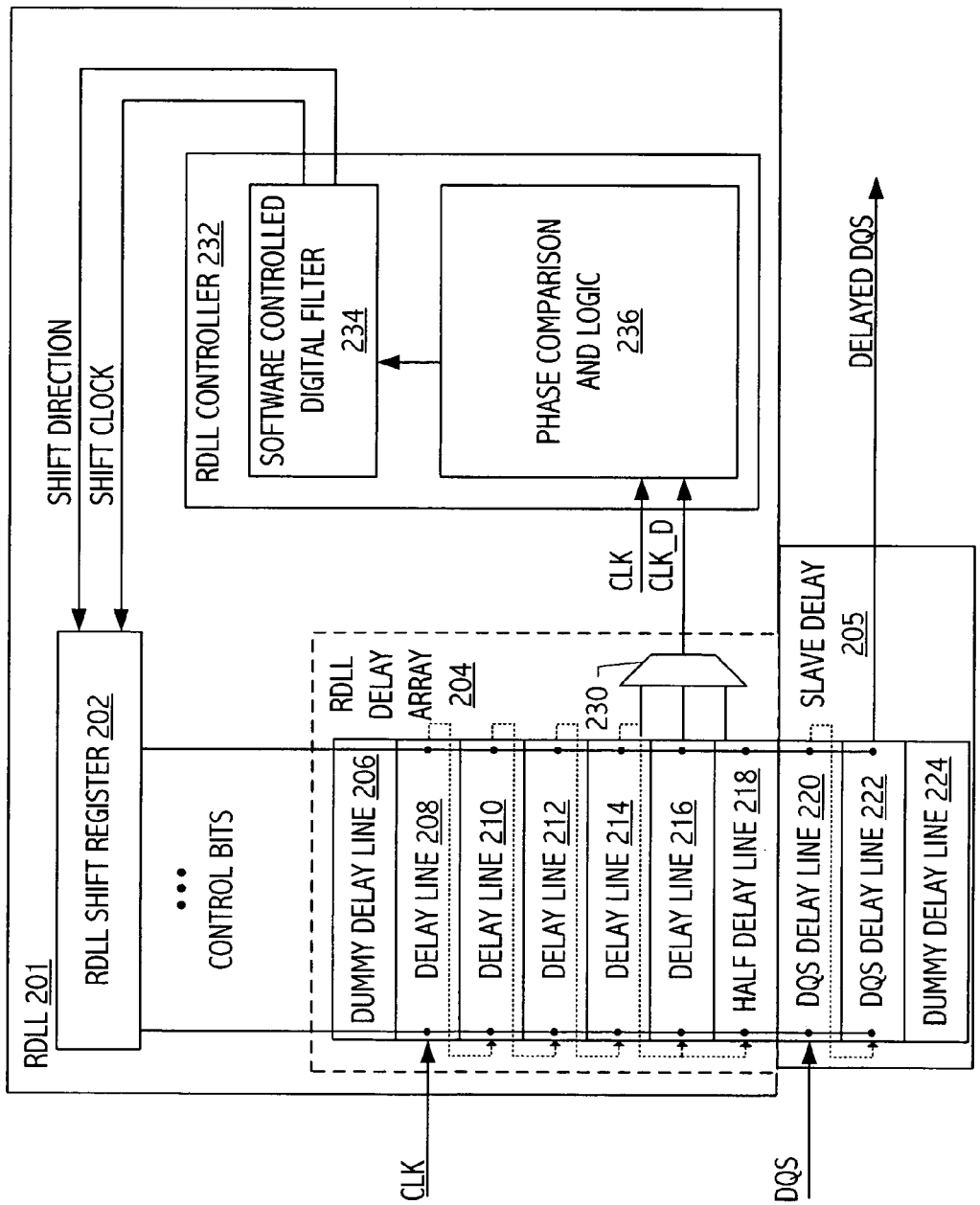
FIG. 2 illustrates an exemplary digital delay-locked loop in accordance with some embodiments of the present invention.

An exemplary RDLL, e.g., RDLL 201, coupled to a slave delay line, e.g., slave delay 205, is illustrated in FIG. 2. RDLL delay array 204 includes a plurality of delay lines, e.g., delay lines 206, 208, . . . , 218. Delay lines 208, 210, . . . , 218 are coupled in series, i.e., the output of delay line 208 is coupled to the input of delay line 210, etc. Individual ones of delay lines 208, 210 . . . , 218 are coupled in parallel to receive a control code from RDLL shift register 202. Although six delay lines are coupled in series, any suitable number of delay lines may be included in RDLL delay array 204. Delay lines 208, 210, . . . , 218 are typically n bits wide and responsive to a control code n bits wide. Dummy delay line 206 is formed adjacent to delay line 208 to provide a consistent environment for the manufacture of delay line 208, but is typically not functionally coupled to delay lines 208, 210, . . . , 218. Delay line 208 receives a reference clock, e.g., CLK, and a delayed clock is output by delay lines 214, 216, and 218. Although three delayed clock outputs are provided by RDLL delay array 204, one or more delayed clock outputs may be provided. Since multiple delay clock outputs are provided, multiplexer 230 is included to select an output delayed reference clock, e.g., CLK_D, that corresponds to the reference clock delayed by one period. Multiplexer 230 is controlled by software to determine whether 4, 4.5, or 5 delay lines generate CLK_D, to normalize one period of CLK to the delay through 4, 4.5, or 5 delay lines.

Figure 3:
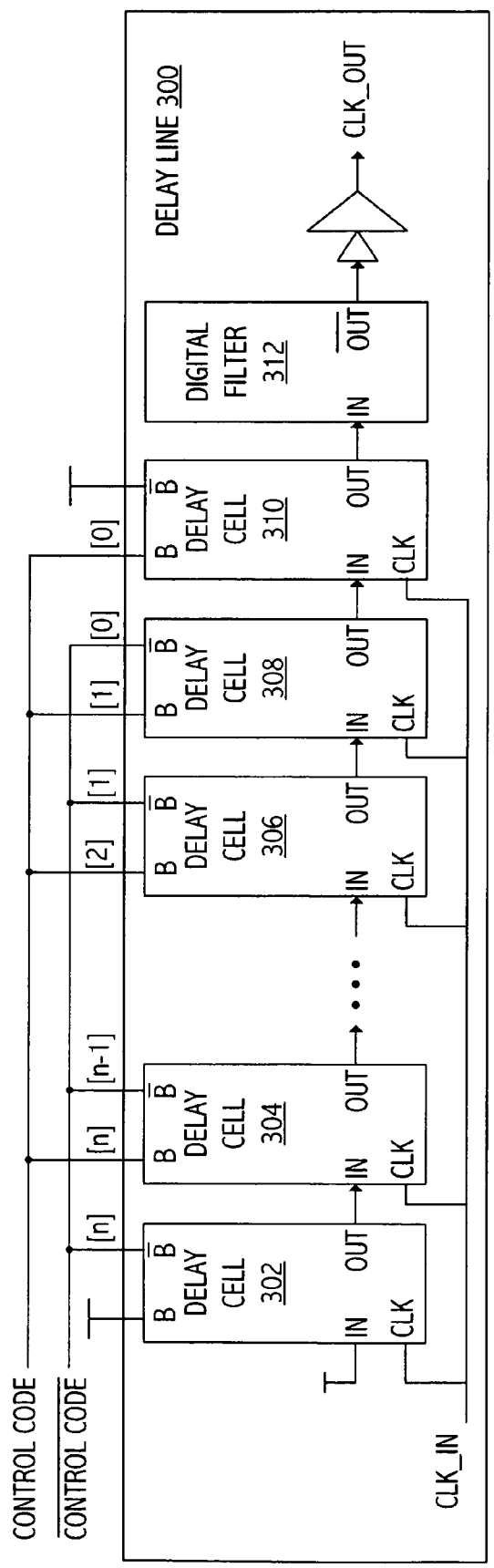
FIG. 3 illustrates an exemplary delay line in accordance with some embodiments of the present invention.
Figure 4:
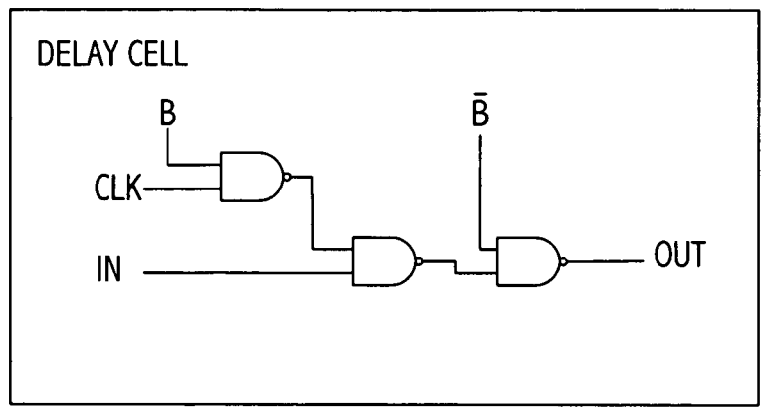
FIG. 4 illustrates an exemplary delay bit cell in accordance with some embodiments of the present invention.
Figure 5:
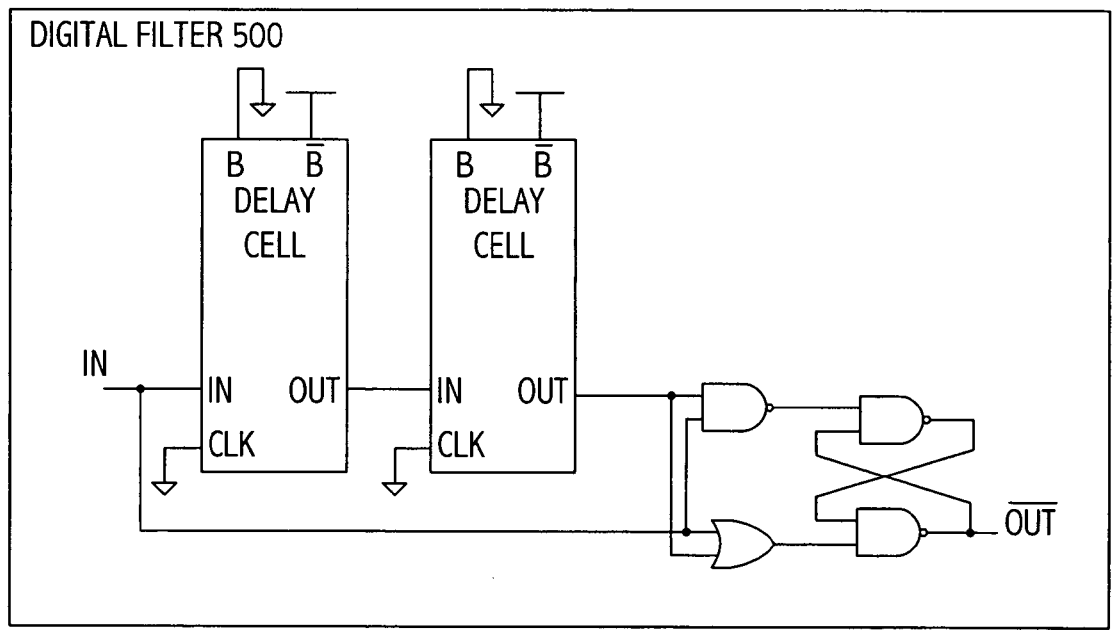
FIG. 5 illustrates an exemplary digital filter in accordance with some embodiments of the present invention.

Delay lines 206, 208, . . . , 218 may be implemented by an exemplary delay line, e.g., delay line 300 illustrated in FIG. 3. Delay line 300 includes n delay bit cells, e.g., delay cell 302, 304, . . . , 310, coupled in series. The n delay cells are coupled to an n-bit control code, one bit of the control code controlling an individual delay cell of delay line 300. An exemplary delay bit cell is NAND gate-based, as illustrated in FIG. 4. The propagation delay through the delay cell resulting from a high-to-low transition is approximately equal to the delay of a low-to-high transition, independent of process variations because while one NAND transitions from high to low, the other switches from low to high. An exemplary delay line includes a digital filter on the output of the delay line, e.g., digital filter 312 of delay line 300, to reduce any glitches generated e.g., by timing differences in the control bits. The inclusion of digital filter 312 in delay lines 222 and 224 reduces the latching of erroneous data by state elements in FIFO 110. An exemplary digital filter, e.g., digital filter 500, is illustrated in FIG. 5, however any suitable digital filter may be used. In addition, longer than minimum channel transistors may be used to provide an appropriate delay.

In one embodiment of the present invention, the control code is a thermometer code, i.e., the control code includes a sequence of bits having a single transition between one and zero in the individual bits. The point where the code transitions from zero to one is the point where additional delay cells are not providing a substantial contribution to the effective delay of the delay line. An increased number of ones in the control code corresponds to fewer delay cells contributing to the effective delay of the delay line. For example, a control code of "11000" coupled to an exemplary delay line including five delay bit cells will delay a signal by a delay based on a delay contribution of four delay bit cells.

Referring back to FIG. 2, since delay lines 208, 210, . . . , 216 have the same number of delay bit cells and receive the same control code, individual ones of delay bit lines 208, 210, . . . , 216 provide substantially the same delay contribution to RDLL delay array 204. Delay line 214 outputs a clock signal delayed by 4 delay lines since delay lines 208, 210, 212, and 214 are coupled in series and are responsive to effectively identical control codes. Delay line 216 outputs a clock signal delayed by 5 delay lines since delay lines 208, 210, 212, 214, and 216 are coupled in series and are responsive to effectively identical control codes.

Delay line 218 is configured to contribute approximately half the delay contribution of delay lines 208, 210, . . . , 216, by using only every other delay bit cell, although in some embodiments, the number of delay bit cells included in delay line 218 is the same as the number of delay bit cells included in delay lines 208, 210, . . . , 216. The respective delay bit cells of delay line 218 receive control code bits of corresponding delay bit cells of delay lines 208, 210, . . . , 216. Other fractional delay lines may be implemented by suitably configuring a delay line accordingly. Note that delay line 218 outputs a clock signal having a delay corresponding to 4.5 delay lines because delay line 218 is coupled in series with delay line 214, which outputs a clock having a delay corresponding to four similar delay lines receiving effectively the same control code.

In an exemplary process technology, the delay of a delay cell may vary, e.g., by a factor of 3.2 as a function of PVT variations. The RDLL may be designed to handle a large duty cycle error (D) of CLK. For proper operation of the phase comparators upon reset, a shift register reset code sets the delay array's CLK delay, e.g., $T_A$, in terms of the CLK period ($T_{MClk2}$) as follows:

$$(0.5+D)*T_{CLK} \leq T_A \leq (1.5-D)*T_{CLK}$$

Figure 7:
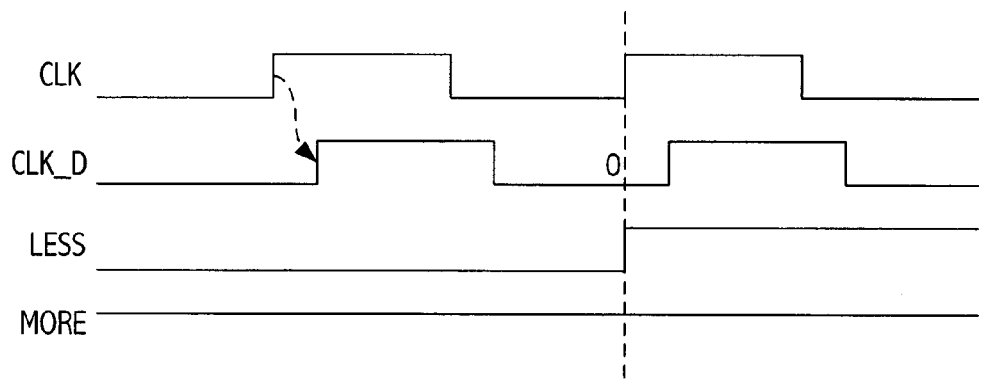
FIG. 7 illustrates exemplary waveforms in accordance with some embodiments of the present invention.
Figure 8:
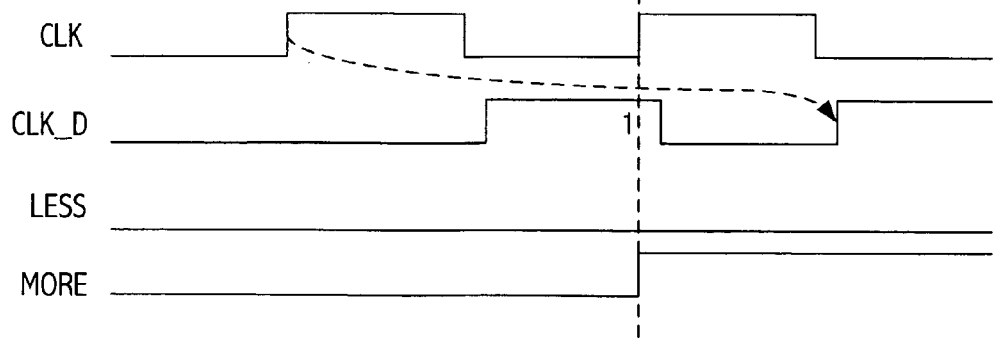
FIG. 8 illustrates exemplary waveforms in accordance with some embodiments of the present invention.

Delays outside of this range may be incorrectly interpreted, as illustrated in FIGS. 7 and 8. When $T_A<(0.5+D)*T_{CLK}$, the delay is incorrectly interpreted as being too long and the controller will attempt to shift more 1's into the shift register, thereby activating fewer delay bit cells. When $T_A>(1.5-D)*T_{CLK}$, the delay is incorrectly interpreted as being too short. RDLL 201 will lock properly at startup when the maximum delay variation of a delay cell ($\Delta T_C$) across PVT variations is $\Delta T_C=(1.5-D)/(0.5+D)$. Since $\Delta T_C$ may vary by a factor of 3.2 with PVT variations, a single shift register reset code does not satisfy the $T_A$ constraints. Accordingly, the shift register reset code may be set consistent with the slowest delay cell, worst-case duty cycle, and highest CLK frequency producing a maximum $T_A$ at reset being $$T_A \leq (1.5-D)*T_{CLK},$$

to decrease false locks of the RDLL at twice the reference frequency. However, in the fastest PVT conditions, the delay may be interpreted as being too long (see, e.g., FIG. 7). The delay bit cell is sized such that a control code of all 1's should never be necessary, even under the slowest PVT conditions. RDLL controller 232 typically detects when the shift register contains all ones and in response, resets RDLL shift register 202 to a code that corresponds to more delay than the original reset value. The second reset code is based on a fastest PVT variation and a slowest PVT variation that would cause RDLL shift register 202 to fill with all ones. To provide a robust design that tolerates large PVT variations, an effective delay bit cell PVT variation allowed at a given frequency is:

$$\Delta T_C = \frac{(1.5 - D)^2}{(0.5 + D)^2}.$$

Figure 6:
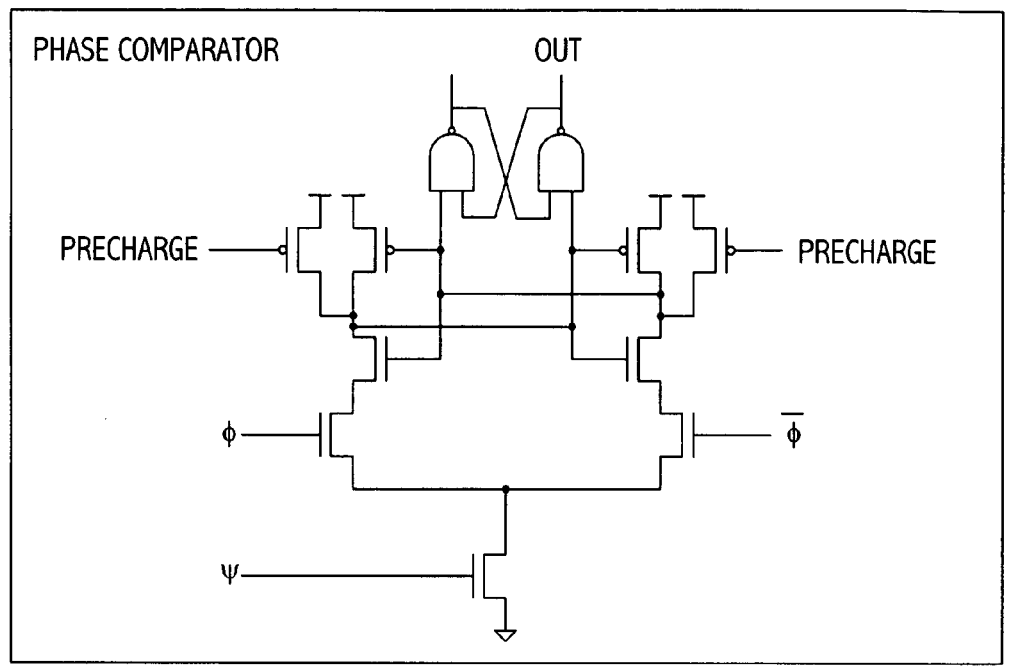
FIG. 6 illustrates an exemplary phase comparator in accordance with some embodiments of the present invention.

The output, i.e., CLK_D, of RDLL delay array 204 drives a phase comparator, e.g., phase comparator and logic block 236 included in RDLL controller 232. An exemplary phase comparator circuit is illustrated in FIG. 6, however, any suitable phase comparator may be used. RDLL controller 232 may include multiple phase comparators stages in series to remove metastability. Phase comparison and logic block 236 compares transitions (e.g., rising edges) of samples of CLK and CLK_D. In some embodiments of the present invention, comparisons of a plurality of samples are used to determine a shift direction of the control code. Digital filter 234, which may be programmable through software, is used before updating the control code to reduce jitter. For example, digital filter 234 may average the results for a number of comparisons to determine the shift direction. If the average indicates that CLK_D is late (i.e., CLK_D transitions after CLK), then less delay is needed in RDLL delay array 204 and the output of RDLL controller 232 indicates a shift right of the control code. If the average indicates that CLK_D is early (i.e., CLK_D transitions before CLK), then more delay is needed in RDLL delay array 204 and the output of RDLL controller 232 indicates a shift left of the control code. Digital filter 234 may base the shift direction on a number (predetermined or programmable) of consecutive results. For example, if CLK_D is determined to be early in five out of eight samples, then more delay is needed in RDLL delay array 204 and the output of RDLL controller 232 indicates a shift left of the control code. In an exemplary embodiment, a power saving feature includes enabling a deadband zone, i.e., an acceptable range of values for CLK_D around an ideal value for CLK_D, which is controllable through software. This feature saves power by reducing the frequency of delay adjustments, but may introduce a small increase in static error.

Slave delay array 205 includes delay lines 220, 222, and 224. Dummy delay line 224 is formed adjacent to delay line 222 to provide a consistent environment for the manufacture of delay line 222, but is typically not functionally coupled to delay lines 220 and 222 and in some realizations of the invention, may be omitted. Although two delay lines are coupled in series, any suitable number of delay lines may be included in slave delay array 205. Typically, the number of delay lines included in a slave delay array is less than the number of delay lines included in a master delay array, to provide a predetermined fractional relationship between the delayed strobe signal and the reference clock, i.e., the strobe signal is delayed by a predetermined fraction of the period of the reference clock, without a divide or a multiply. For example, the two delay lines of slave delay 205 delay a strobe signal by 2/4, 2/4.5, or 2/5 of the reference clock period to produce a 50%, 45%, or 40% delay. In general, the RDLL delay array 204 and slave delay array 205 may delay a strobe signal by a predetermined ratio of Y/X by adjusting the number of delay lines included in RDLL delay array 204 and slave delay array 205 and by selecting among the output of these delay lines to drive phase comparator 236.

What is claimed is:

1. An integrated circuit comprising:
   a first delay circuit coupled to receive a control code, the control code configuring the first delay circuit to delay a reference clock signal by one clock period; and
   a second delay circuit coupled to receive the control code, the control code configuring the second delay circuit to delay a signal by a predetermined fraction of the clock period.

2. The integrated circuit, as recited in claim 1, wherein the first delay circuit includes a first plurality of delay lines and the second delay circuit includes a second plurality of delay lines, individual ones of the first plurality of delay lines being coupled in series and individual ones of the second plurality of delay lines being coupled in series, the predetermined fraction being based at least in part on a number of delay lines in the first plurality and a number of delay lines in the second plurality.

3. The integrated circuit, as recited in claim 1, wherein the control code is based at least in part on a delayed reference clock signal.

4. The integrated circuit, as recited in claim 1, further comprising:
   a register coupled to provide the control code to the first and second delay circuits.

5. The integrated circuit, as recited in claim 4, further comprising:
   a controller circuit coupled to the register circuit and coupled to receive a delayed reference clock signal from the first delay circuit.

6. The integrated circuit, as recited in claim 5, wherein the register is a shift register.

7. The integrated circuit, as recited in claim 6, wherein the shift register receives a shift direction and a shift clock from the controller circuit.

8. The integrated circuit, as recited in claim 2, wherein individual delay lines of the first and second delay circuits are coupled in parallel to receive the control code, the control code controlling effective delays of the delay lines.

9. The integrated circuit, as recited in claim 2, wherein individual ones of the delay lines of the first and second delay circuits are configured to provide an effectively equivalent delay.

10. The integrated circuit, as recited in claim 2, wherein the delay lines of the first and second delay circuits include a plurality of delay bit cells coupled in series.

11. The integrated circuit, as recited in claim 10, wherein respective ones of the delay bit cells of the individual delay lines include select signals coupled in parallel to receive a corresponding bit of the control code.

12. The integrated circuit, as recited in claim 10, wherein the individual delay bit cells are selected by a thermometer code.

13. The integrated circuit, as recited in claim 10, wherein a maximum delay ($\Delta T_C$) of at least one of the delay cells at a predetermined frequency having a duty cycle error (D), satisfies the relationship:

$$\Delta T_C = (1.5-D)^2/(0.5+D)^2.$$

14. The integrated circuit, as recited in claim 2, wherein individual delay lines include a digital filter coupled to an output of the delay line.

15. The integrated circuit, as recited in claim 2, wherein at least one of the first and second delay circuits includes a delay line configured to provide a predetermined fraction of a delay provided by another delay line.

16. The integrated circuit, as recited in claim 5, wherein the controller circuit further comprises:
  a phase comparator coupled to receive the reference clock signal and the delayed reference clock signal; and
  a digital filter coupled to the phase comparator to reduce an effect of jitter on an output of the phase comparator for controlling the register.

17. The integrated circuit, as recited in claim 2, further comprising:
  at least one selection circuit coupled to outputs of individual delay lines of at least one of the first delay circuit and the second delay circuit, the selection circuit selecting the predetermined fraction of the clock period from a plurality of predetermined fractions of the clock period.

18. A method comprising:
  delaying a reference clock by one period using a first delay circuit;
  delaying a control signal by a predetermined fraction of the clock period using a second delay circuit; and
  controlling the first and second delay circuits using a control code based at least in part on the reference clock and a delayed reference clock.

19. The method, as recited in claim 18, wherein the first delay circuit includes a first plurality of delay lines and the second delay circuit includes a second plurality of delay lines, individual ones of the first plurality of delay lines being coupled in series and individual ones of the second plurality of delay lines being coupled in series, the predetermined fraction being based at least in part on a number of delay lines in the first plurality and a number of delay lines in the second plurality.

20. The method, as recited in claim 19, further comprising:
  comparing a phase of the reference clock to a phase of the delayed reference clock to generate the control code.

21. The method, as recited in claim 18, further comprising:
  comparing a phase of the reference clock to a phase of the delayed reference clock to generate the control code.

22. The method, as recited in claim 18, further comprising:
  reducing an effect of jitter on the control code.

23. The method, as recited in claim 18, further comprising:
  shifting the contents of a register to generate the control code.

24. The method, as recited in claim 18, wherein the control code is a thermometer code.

25. The method, as recited in claim 18, further comprising:
  selecting the delayed reference clock from a plurality of delayed reference clocks provided by the first delay circuit.

26. The method, as recited in claim 18, further comprising:
  selecting the delayed signal from a plurality of delayed signals provided by the second delay circuit.

27. The method, as recited in claim 18, further comprising:
  reducing glitches in an output of at least one of the first and second delay circuits.

28. A computer readable medium encoding an integrated circuit product comprising:
  a first delay circuit coupled to receive a control code, the control code configuring the first delay circuit to delay a reference clock signal by one clock period; and
  a second delay circuit coupled to receive the control code, the control code configuring the second delay circuit to delay a signal by a predetermined fraction of the clock period.

29. The computer readable medium encoding an integrated circuit product, as recited in claim 28, wherein the first delay circuit includes a first plurality of delay lines and the second delay circuit includes a second plurality of delay lines, individual ones of the first plurality of delay lines being coupled in series and individual ones of the second plurality of delay lines being coupled in series, the predetermined fraction being based at least in part on a number of delay lines in the first plurality and a number of delay lines in the second plurality.

30. The computer readable medium encoding an integrated circuit product, as recited in claim 28, wherein the control code is based at least in part on a delayed reference clock.

31. The computer readable medium encoding an integrated circuit product, as recited in claim 28, further comprising:
  a register coupled to provide the control code to the first and second delay circuits.

32. The computer readable medium encoding an integrated circuit product, as recited in claim 29, wherein individual delay lines of the first and second delay circuits are coupled in parallel to receive the control code, the control code controlling effective delays of the delay lines.

33. The computer readable medium encoding an integrated circuit product, as recited in claim 29, wherein individual ones of the delay lines of the first and second delay circuits are configured to provide an effectively equivalent delay.

34. A method of manufacturing an integrated circuit design comprising:
  forming a first delay circuit coupled to receive a control code, the control code configuring the first delay circuit to delay a reference clock signal by one clock period; and
  forming a second delay circuit coupled to receive the control code, the control code configuring the second delay circuit to delay a signal by a predetermined fraction of the clock period.

35. The method as recited in claim 34, wherein the first delay circuit includes a first plurality of delay lines and the second delay circuit includes a second plurality of delay lines, individual ones of the first plurality of delay lines being coupled in series and individual ones of the second plurality of delay lines being coupled in series, the predetermined fraction being based at least in part on a number of delay lines in the first plurality and a number of delay lines in the second plurality.

36. The method as recited in claim 34, wherein the control code is based at least in part on a delayed reference clock signal.

37. The method as recited in claim 34, further comprising:
  forming a register coupled to provide the control code to the first and second delay circuits.

38. The method as recited in claim 37, further comprising:
  forming a controller circuit coupled to the register circuit and coupled to receive a delayed reference clock signal from the first delay circuit.

39. The method as recited in claim 38, wherein the register is a shift register responsive to a shift direction and a shift clock received from the controller circuit.

40. The method as recited in claim 36, wherein outputs corresponding to individual ones of the delay lines of the first delay circuit are coupled in series and outputs corresponding to individual ones of the delay lines of the second delay circuit are coupled in series and individual delay lines are coupled in parallel to receive the control code, the control code controlling effective delays of the delay lines.

41. The method as recited in claim 34, wherein the control code is a thermometer code selecting individual delay bit cells of individual delay lines.

42. The method as recited in claim 34, further comprising:
forming at least one selection circuit coupled to outputs of individual delay lines of at least one of the first delay circuit and the second delay circuit, the selection circuit selecting the predetermined fraction of the clock period from a plurality of predetermined fractions of the clock period.

43. A delay-locked loop (DLL) having a first delay line and a second delay line, the first delay line being responsive to a control code to delay a reference clock by at least a portion of one clock period, the second delay line being responsive to the control code to delay a signal by at most a predetermined fraction of the reference clock period, the control code being based at least in part on an output of the first delay line.

44. The delay-locked loop (DLL), as recited in claim 43, wherein the first delay line is an individual one of a first plurality of delay lines coupled in series to delay the reference clock by one clock period and the second delay line is an individual one of a second plurality of delay lines coupled in series to delay the signal by the predetermined fraction of the reference clock, individual ones of the first and second pluralities of delay lines being coupled in parallel to receive the control code.

45. An apparatus comprising:
means for delaying a reference clock by one period;
means for delaying a control signal by a predetermined fraction of the clock period; and
means for controlling the means for delaying a reference clock and means for delaying a control signal using a control code based at least in part on the reference clock and a delayed reference clock.

46. The apparatus as recited in claim 45 further comprising:
means for generating the control code.

47. The integrated circuit, as recited in claim 1, wherein the signal is a strobe signal that is edge-aligned to a data signal from a memory and the delayed signal is configured to clock the data signal into a state element.

48. The method, as recited in claim 18, wherein the control signal is edge-aligned to a data signal from a memory and the delayed control signal is configured to clock the data signal into a state element.

49. The apparatus, as recited in claim 45, wherein the control signal is edge-aligned to a data signal from a memory and the delayed control signal is configured to clock the data signal into a state element.

50. The apparatus, as recited in claim 45, wherein the means for delaying comprises:
means for selecting the delayed reference clock from a plurality of delayed reference clocks.

51. The computer readable medium encoding an integrated circuit product, as recited in claim 28, further comprising:
at least one selection circuit coupled to outputs of individual delay lines of at least one of the first delay circuit and the second delay circuit, the selection circuit selecting the predetermined fraction of the clock period from a plurality of predetermined fractions of the clock period.

52. The DLL, as recited in claim 43, wherein the DLL comprises at least one selection circuit coupled to outputs of individual delay lines of at least one of the first delay circuit and the second delay circuit, the selection circuit selecting the predetermined fraction of the clock period from a plurality of predetermined fractions of the clock period.

* * * * *